United States Patent
Sin et al.

[11] Patent Number: 5,869,847
[45] Date of Patent: Feb. 9, 1999

[54] THIN FILM TRANSISTOR

[75] Inventors: Johnny Kin-On Sin, Shatin; Anish Kumar Kottarath Parambil, Kowloon; Man Wong, Causeway Bay, all of Hong Kong

[73] Assignee: The Hong Kong University of Science & Technology, Hong Kong, Hong Kong

[21] Appl. No.: 959,074

[22] Filed: Oct. 28, 1997

Related U.S. Application Data

[63] Continuation of Ser. No. 504,337, Jul. 19, 1995, abandoned.

[51] Int. Cl.$^6$ .................................................... H01L 29/76
[52] U.S. Cl. ............................ 257/66; 257/59; 257/346; 257/345; 257/347; 438/156; 438/158; 438/163
[58] Field of Search ............................ 257/66, 347, 346, 257/344, 345, 59, 368; 438/156, 158, 163

[56] References Cited

U.S. PATENT DOCUMENTS

| | | | |
|---|---|---|---|
| 5,122,846 | 6/1992 | Haken | 257/66 |
| 5,182,624 | 1/1993 | Tran et al. | 257/59 |
| 5,294,811 | 3/1994 | Aoyama et al. | 257/66 |
| 5,430,320 | 7/1995 | Lee | 257/66 |
| 5,444,271 | 8/1995 | Kulwahara et al. | 257/66 |

*Primary Examiner*—Valencia Martin-Wallace
*Attorney, Agent, or Firm*—Burns, Doane, Swecker & Mathis, L.L.P.

[57] ABSTRACT

A thin film transistor (TFT) comprises a $n^+$ source region and a $p^+$ drain separated by an undoped offset region, or the complementary structure with a $p^+$ source and a $n^+$ drain. By means of this arrangement in the offset region is conduction is by way of both electron and hole carriers and the offset region is conductivity modulated. The TFT of the present invention has lower on-resistance than a conventional thin film transistor.

10 Claims, 4 Drawing Sheets

THIN FILM TRANSISTOR

This application is a continuation of application Ser. No. 08/504,337, filed Jul. 19, 1995 now abandoned.

FIELD OF THE INVENTION

This invention relates to a thin film transistor, and in particular to a novel high voltage conductivity modulated thin film transistor.

1. BACKGROUND OF THE INVENTION

A thin film transistor (TFT) is an insulated-gate field effect transistor that is fabricated using thin film techniques on an insulating substrate rather than a semiconductor. Integrated circuits built using polysilicon thin film transistors at low temperatures have attracted much attention in various large area applications such as, for example, flat panel displays, page width optical scanners and page width printer heads. Research has led to various designs which all have as their objective increasing the breakdown voltage and the switching speed, and reducing the leakage current.

In conventional TFTs the drain is offset from the channel region in order to achieve low leakage current. However, this offset causes a high on-resistance which in turn results in a severe current pinching problem. This problem is even more severe in high voltage TFT devices since a longer offset region is required.

2. PRIOR ART

To alleviate this current pinching problem a number of approaches have been employed. For example a low concentration implant has been used to dope the offset region, K. Tanaka, H. Arai, and S. Kohda, "Characteristics of offset-structure polycrystalline-silicon thin-film transistors.", IEEE Electron. Dev. Lett. Vol. 9 No. 1, pp 23–25, 1988. However the required implant is very difficult to achieve. This is due to the fact that both background doping and doping efficiency are very closely related to grain size and defects at grain boundaries and within the grains, and inevitably these parameters vary from run to run.

A field plated high voltage TFT has also been proposed to solve the current pinching problem, T. Y. Huang, I-Wei Wu, Alan G. Lewis, Anne Chiang and Richard H. Bruce, "A Simpler 100V Polysilicon TFT with Improved Turn-On Characteristics", IEEE Electron. Dev. Lett., Vol. 11, No.6, pp 244–246, 1990. This offers a higher current driving capability while still maintaining a low leakage. However this approach results in a complicated device structure and biasing scheme.

SUMMARY OF THE INVENTION

According to the present invention there is provided a thin film transistor comprising a source and a drain, each being formed of a doped polysilicon material on an insulating substrate, said source and said drain being spaced apart by undoped polysilicon material which forms the channel region and by an offset region, wherein said source comprises primarily $n^+$ material and said drain comprises $p^+$ material, or wherein said source comprises $p^+$ material and said drain comprises $n^+$ material, whereby in said offset region conduction is by both electron and hole carriers.

By means of this arrangement the offset region is effectively conductivity modulated. At a gate voltage above the threshold voltage and with a sufficiently high drain to source voltage, holes are injected from the $p^+$ drain into the offset region and electrons flow in from the channel (or the reverse if the complementary structure of a $p^+$ source and a $n^+$ drain is chosen). The injected holes recombine with the grain boundary traps and thus facilitate the flow of electrons in the offset region. The high concentration of injected holes in the offset region conductivity modulates the region and provides much lower on-resistance compared to that of the conventional offset drain TFT. The length of the offset region may be variable depending on the desired breakdown voltage, the higher the breakdown voltage required the longer the offset region.

The insulating substrate may be silicon with an oxide layer thereon, or alternatively the polysilicon may be formed on glass.

Since the density of traps in polysilicon is very high the minority carrier life-time is very short and so the TFT of the present invention does not experience any latch-up and there is no degradation of switching speed.

The source region preferably comprises a segmented source, particularly the source may comprise a $n^+$ to $p^+$ (or $p^+$ to $n^+$) segmentation ratio of about 10:1.

If desired the thin film transistor of the present invention may be hydrogenated, though the enhancement by hydrogenation of the on-state current is less marked with a TFT of the present invention than with a conventional TFT since the on-state performance of the TFT of the present invention is less dependent on the reduction of recombination centres in the offset region but more dependent on the existence of minority carriers for conductivity modulation.

BRIEF DESCRIPTION OF THE DRAWINGS

An embodiment of the invention will now be described by way of example and with reference to the accompanying drawings, in which FIGS. 1(a) and (b) are schematic views of a conventional thin film transistor and a thin film transistor according to an embodiment of the present invention respectively.

DETAILED DESCRIPTION OF PREFERRED EMBODIMENT

Figure 1A:
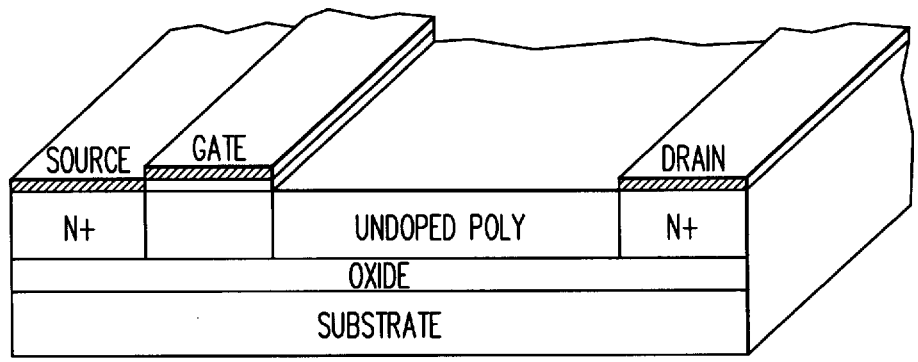
Figure 1B:
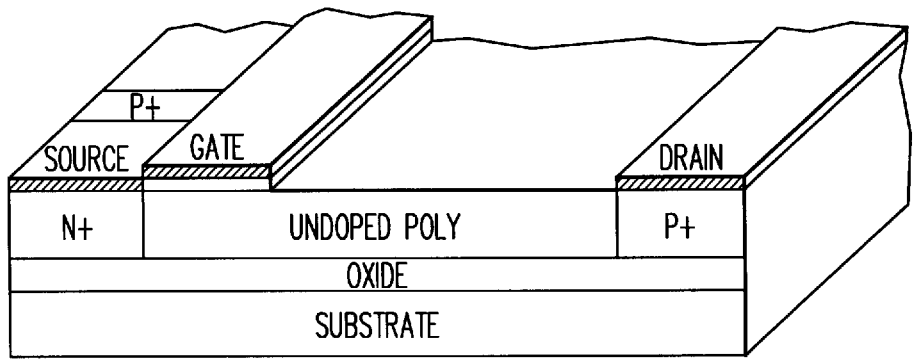

FIG. 1(a) shows a schematic cross-section of a conventional offset drain TFT. FIG. 1(b) shows a similar view of a TFT according to an embodiment of the present invention. The conventional offset drain TFT shown in FIG. 1(a) is a majority carrier device and has an offset region placed between the drain and channel region for low leakage current and high breakdown voltage. The TFT of the present invention, however, is a mixed carrier device in which both electrons and holes are responsible for current conduction.

As shown in FIG. 1(b) the TFT according to this embodiment of the present invention incorporates a $p^+$ drain instead of the conventional $n^+$ drain. At a gate voltage above the threshold voltage and with a sufficiently high drain to source voltage, holes are injected from the $p^+$ drain into the offset region while electrons flow in from the channel. The injected holes recombine with the grain boundary traps and facilitate the flow of electrons in the offset region. The high concentration of injected holes in the offset region conductivity modulates the region and provides much lower on-resistance compared to that of conventional offset drain TFTs ( the TFT of the present invention may therefore be referred to as a conductivity modulated thin film transistor—CMTFT—and will be so referred to in the remainder of this description). Since the density of traps is very high in polysilicon the minority carrier life-time is very short and thus the CMTFT has no degradation in switching speed is observed. It will of course be understood that whilst in the illustrated embodiment the source is $n^+$ and the drain $p^+$, the complementary structure may also be employed with the source $p^+$ and the drain $n^+$.

To contact the channel region of the device of the present invention which is built on a very thin film (<1500 A), a segmented source structure is used as shown in FIG. 1(b). The source comprises $n^+$ and $p^+$ material in a segmentation ratio of about 10:1. This ratio may be optimised for particular applications. For devices built on thicker films no segmented source is needed for contacting the channel region.

A CMTFT according to an embodiment of the present invention, and in addition a conventional offset drain TFT for comparison, were fabricated using a low temperature process at 620° C. (though a temperature of 600° C. is also possible). Silicon wafers with a thermally grown 5000 A oxide layer were used as the starting substrate. The polysilicon film was then formed by first depositing a layer of amorphous Si at 550° C. using LPCVD (low pressure chemical vapour deposition). It was then recrystallized to polysilicon by subsequent annealing at 600° C. in $N_2$ ambient for 2 hours. A 1000 A APCVD (atmospheric pressure chemical vapour deposition) gate oxide was used. The gate polysilicon layer was then deposited at 620° C. (again, 600° C. is also possible) using LPCVD. $p^+$ and $n^+$ implantations are used to form the drain and source of the transistor. The channel region of the CMTFT was contacted by segmenting the source with a $n^+$ to $p^+$ segmentation ratio of 10:1. The devices were subsequently hydrogenated by depositing a PECVD silicon nitride cap layer at 300° C. with a thickness of 3500 A and annealing in forming gas at 400° C. for 90 minutes. Hydrogenation is a passivation technique for thin film transistors by eliminating charge traps in the polycrystalline silicon by providing a hydrogen bond.

Figure 2:
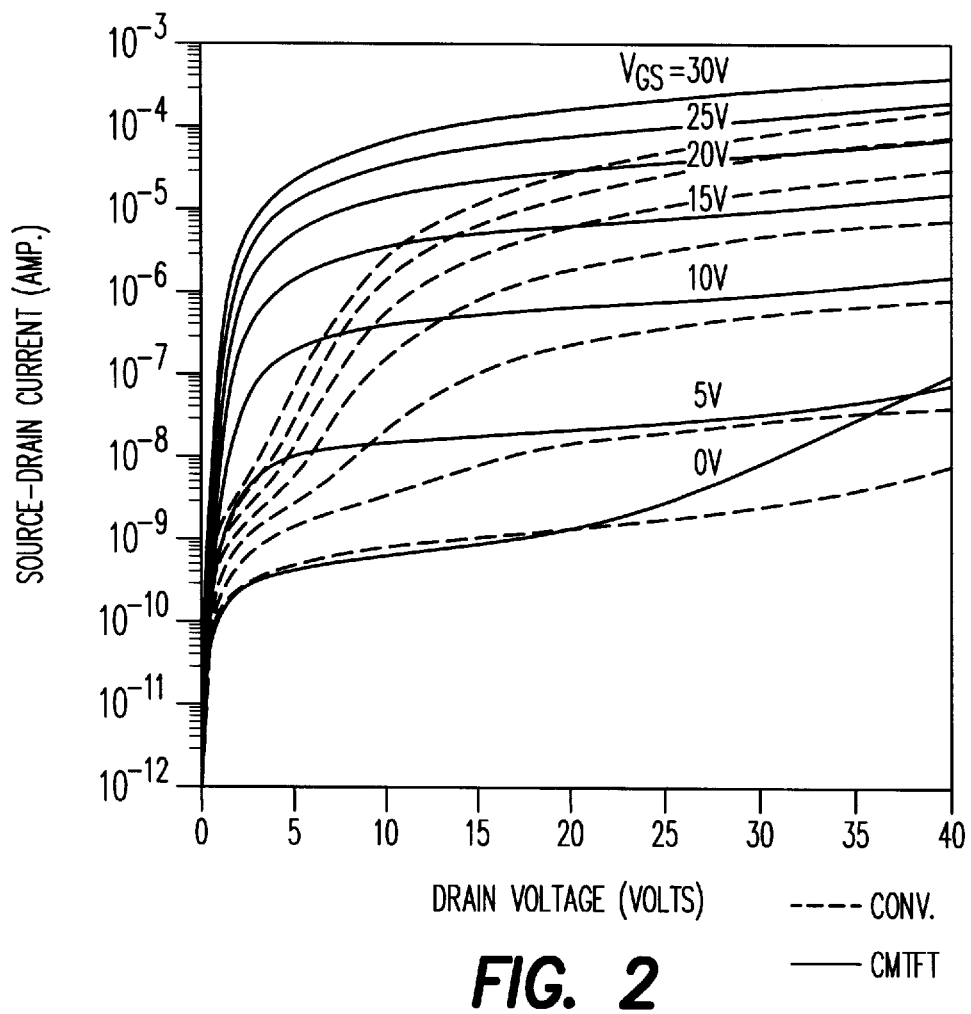
FIG. 2 is a graph comparing the forward conduction characteristics of a conventional offset drain TFT and a TFT according to an embodiment of the present invention.

FIG. 2 compares the forward conduction characteristics of the conventional offset drain TFT with the CMTFT of the present invention. Both devices were formed with identical dimensions and with an offset length of 3 $\mu$m and a W/L ratio of 50/5. As can be seen the conventional offset drain TFT suffers from severe current pinching effects due to the existence of the high resistive undoped polysilicon offset region. At low drain voltages most of the voltage is dropped across the grain boundaries, and the electrons, which flow in from the channel region, fill the traps at the grain boundaries. Hence a higher drain voltage is required to overcome the potential barrier caused by the grain boundaries for higher drain current.

In the case of the CMTFT of the present invention, at a gate voltage above the threshold voltage and drain voltages below 0.7V the $p^+$ drain is off and no holes are injected from the $p^+$ drain into the offset region. The device is basically off and the trapped charges at the grain boundaries are not changed. Thus the resistivity of the offset region remains high. The $p^+$ drain is turned on at drain voltages higher than 0.7V. At higher drain voltages the amount of hole injection increases and a significant interaction between the injected holes and the grain boundary traps occurs. Depending upon the energy of the traps the holes may recombine with trapped electrons or may themselves be trapped. In either case the barrier height formed between grain boundaries is lowered and this reduction in barrier height facilitates flow of both electrons and holes. Due to the increase in both electron and hole concentration in the offset region the resistance of the offset region is reduced. This in turn increases the current handling capability of the device.

As the drain voltage is further increased, channel pinching occurs and the CMTFT experiences drain current saturation at a high drain voltage. From FIG. 2 it can be seen that at a gate voltage of 20V and with a drain voltage ranging from about 5V to 15V, the on-state current of the CMTFT is from three orders of magnitude to six times higher than that of a conventional offset drain TFT. By proper optimization of the active polysilicon film thickness, the hole injection efficiency of the $p^+$ drain can be maximized for even better current handling capability.

Figure 3:
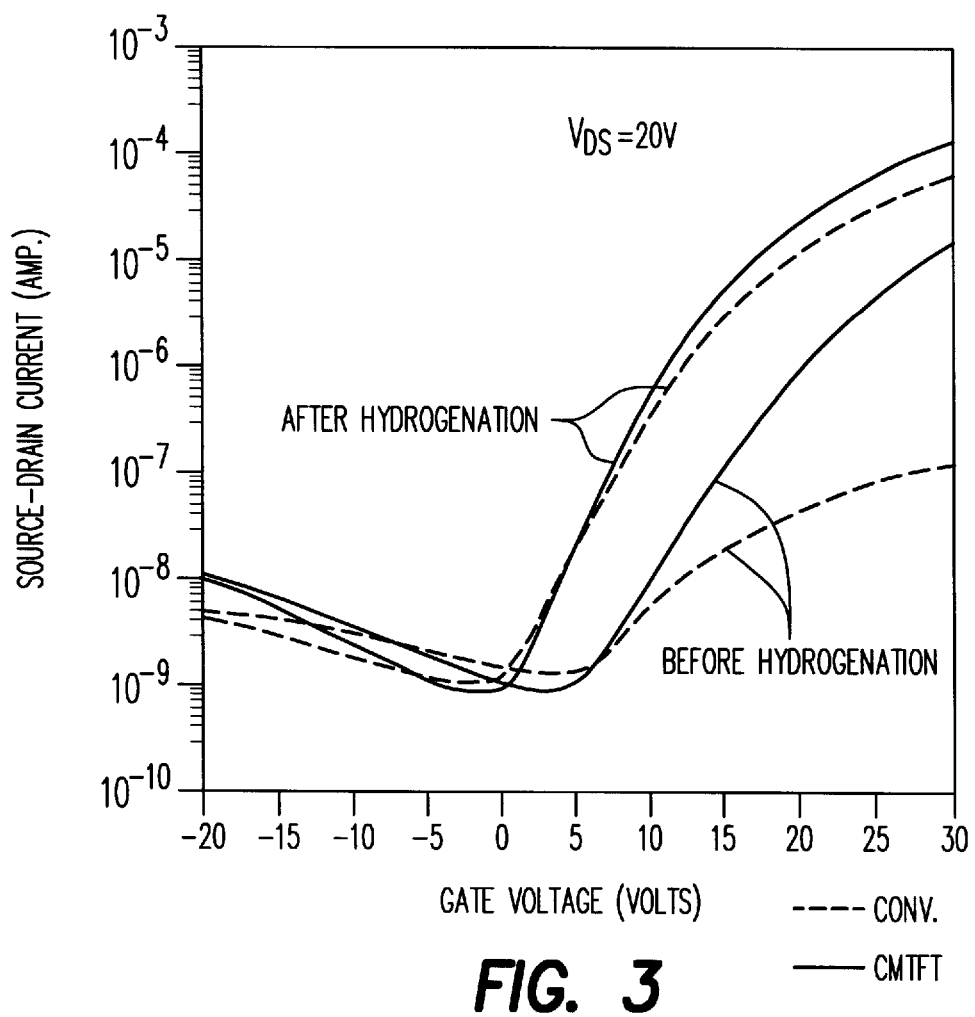
FIG. 3 is a graph illustrating the effects of hydrogenation on a conventional offset drain TFT and a TFT according to an embodiment of the present invention.

The gate transfer characteristics for both the conventional TFT and the CMTFT of the present invention are shown in FIG. 3 before and after hydrogenation. The dependence of leakage current to the gate and drain voltage for both devices is similar and remains so after hydrogenation. The amount of leakage current measured for the devices is the same and comparable to that reported in the literature, Tanaka et al as above. It is important to note that the threshold voltage, subthreshold slope and leakage current are reduced for both devices after hydrogenation. The hydrogenation enhances the on-state current of the conventional TFT by quite a large amount, but does not enhance in the same proportion the on-state current in the CMTFT. This is believed to be due to the fact that the on-state performance of the CMTFT is dictated more by the existence of the mixed carriers for conductivity modulation than by the reduction of recombination centres in the offset region.

Since the CMTFT involves mixed carriers for conductivity modulation, it might be thought that the switching speed of the device would be affected by the minority carrier storage effect. However it has been observed, Ted Kamins: "Polycrystalline Silicon for Integrated Circuit Applications" Kluwer Academic Publishers, that the minority carrier lifetime, as measured from the reverse characteristics of diodes formed within a polysilicon sample with sub-micron grain size, is of the order of 20–100 ps. Therefore the transient behaviour of the CMTFT will not be degraded in comparison with a conventional TFT.

Figure 4:
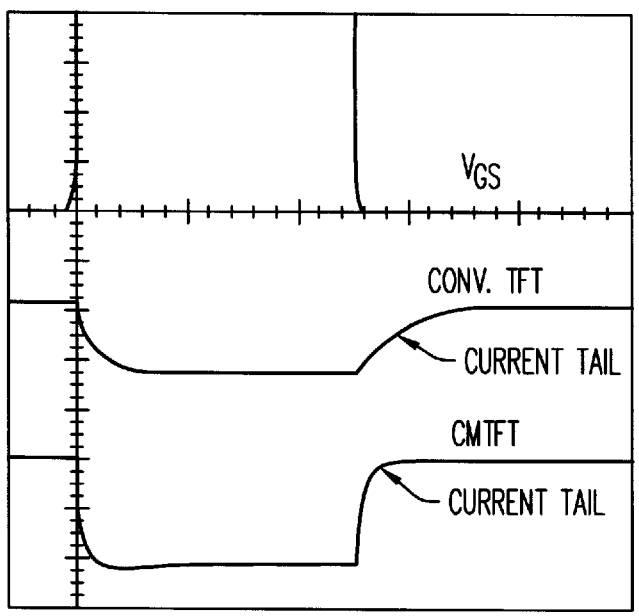
FIG. 4 shows the resistive switching waveforms for a conventional offset drain TFT and a TFT according to an embodiment of the present invention respectively.

FIG. 4 shows the resistive switching waveforms for the conventional offset drain TFT and the CMTFT of the present invention respectively. The measurements were carried out using a resistive load connected between the drain and power supply with the source contacted to ground. As expected, the turn-off time of the CMTFT (43.2 $\mu$s) is not degraded compared to that of the conventional offset drain TFT (162.8 $\mu$s) and in fact a factor of 3.8 times improvement is obtained in the CMTFT due to the higher current sourcing capability. The turn-on time of the CMTFT and conventional TFT is 21 $\mu$s and 67.41 $\mu$s respectively. The 3.2 times reduction of turn-on time in the CMTFT is due to the much smaller on-resistance which discharges the parasitic capacitance of the system faster. It should be noted that the relatively slow switching speed of both structures is due to the large RC constant of the parasitic capacitance inherent in the measurement system. However, the comparison remains valid.

We claim:

1. A thin film transistor comprising a source and a drain, each being formed of a doped polysilicon material on an insulating substrate, said source and said drain being spaced apart by undoped polysilicon material which forms the channel region and by an undoped high resistivity offset region, wherein said source comprises primarily a material of one conductivity and said drain comprises a material of opposite conductivity, and wherein conductivity of said offset region is modulated by injection of holes from said drain.

2. A thin film transistor as claimed in claim 1 wherein the source and the drain are oppositely doped whereby they inject either electrons or holes in accordance with their doping.

3. A thin film transistor as claimed in claim 1 wherein the insulating substrate is silicon with an oxide layer.

4. A thin film transistor as claimed in claim 1 wherein the insulating material is a glass substrate.

5. A thin film transistor comprising a source and a drain, each being formed of a doped polysilicon material on an insulating substrate, said source and said drain being spaced apart by undoped polysilicon material which forms the channel region and by an offset region, wherein said source comprises primarily a material of one conductivity and said drain comprises a material of opposite conductivity, whereby in said offset region conduction is by both electron and hole carriers and wherein said channel region is contacted by a source comprising alternate segments of $n^+$ and $p^+$ regions.

6. A thin film transistor as claimed in claim 5 wherein said source comprises a $n^+$ and $p^+$ and $n^+$ segments, in a ratio of about 10 to 1.

7. A method of manufacturing a thin film transistor, comprising the steps of:
   (a) depositing an amorphous layer of silicon on an insulating substrate,
   (b) recrystallising said amorphous silicon layer to polysilicon by annealing,
   (c) depositing a gate oxide layer and a gate polysilicon layer, and
   (d) doping said polysilicon layer to form a drain and a source, said drain being doped $p^+$ and said source being doped $n^+$ or vice versa, while leaving an undoped channel region and an undoped high resistivity offset region between said source and drain.

8. A method of manufacturing a thin transistor as claimed in claim 7 wherein said method is a low temperature process carried out at temperatures of about 600° C. and below.

9. The thin film transistor of claim 1, wherein said source comprises primarily $n^+$ material and said drain comprises $p^+$ material.

10. The thin film transistor of claim 1, wherein said source comprises primarily $p^+$ and said drain comprises $n^+$ material.

* * * * *